United States Patent
Chen et al.

(10) Patent No.: US 11,741,737 B2
(45) Date of Patent: *Aug. 29, 2023

(54) FINGERPRINT SENSOR IN INFO STRUCTURE AND FORMATION METHOD

(71) Applicant: Taiwan Semiconductor Manufacturing Co., Ltd., Hsinchu (TW)

(72) Inventors: Chih-Hua Chen, Zhubei (TW); Yu-Feng Chen, Hsinchu (TW); Chung-Shi Liu, Hsinchu (TW); Chen-Hua Yu, Hsinchu (TW); Hao-Yi Tsai, Hsinchu (TW); Yu-Chih Huang, Hsinchu (TW)

(73) Assignee: TAIWAN SEMICONDUCTOR MANUFACTURING COMPANY, LTD, Hsin-Chu (TW)

( * ) Notice: Subject to any disclaimer, the term of this patent is extended or adjusted under 35 U.S.C. 154(b) by 155 days.

This patent is subject to a terminal disclaimer.

(21) Appl. No.: 17/320,639

(22) Filed: May 14, 2021

(65) Prior Publication Data

US 2021/0271842 A1    Sep. 2, 2021

Related U.S. Application Data

(63) Continuation of application No. 16/511,721, filed on Jul. 15, 2019, now Pat. No. 11,010,580, which is a (Continued)

(51) Int. Cl.
*G06V 40/13* (2022.01)
*G06F 18/00* (2023.01)
*H01L 21/56* (2006.01)

(52) U.S. Cl.
CPC .......... *G06V 40/1306* (2022.01); *G06F 18/00* (2023.01); *G06V 40/1329* (2022.01); (Continued)

(58) Field of Classification Search
CPC .. G06V 40/1306; G06V 40/1329; G06K 9/00; H01L 21/568; H01L 2224/04105; (Continued)

(56) References Cited

U.S. PATENT DOCUMENTS 6,309,992 B1 * 10/2001 Morita .................. C03C 8/10
501/55
8,361,842 B2 1/2013 Yu et al.
(Continued)

FOREIGN PATENT DOCUMENTS

CN     104848878 A    8/2015
CN     105940413 A    9/2016
(Continued)

*Primary Examiner* — Jerome Grant, II
(74) *Attorney, Agent, or Firm* — Slater Matsil, LLP

(57) ABSTRACT

A package includes a sensor die, and an encapsulating material encapsulating the sensor die therein. A top surface of the encapsulating material is substantially coplanar with or higher than a top surface of the sensor die. A plurality of sensing electrodes is higher than the sensor die and the encapsulating material. The plurality of sensing electrodes is arranged as a plurality of rows and columns, and the plurality of sensing electrodes is electrically coupled to the sensor die. A dielectric layer covers the plurality of sensing electrodes.

20 Claims, 23 Drawing Sheets

Related U.S. Application Data continuation of application No. 15/254,357, filed on Sep. 1, 2016, now Pat. No. 10,354,114.

(60) Provisional application No. 62/349,355, filed on Jun. 13, 2016.

(52) U.S. Cl.
CPC .. *H01L 21/568* (2013.01); *H01L 2224/04105* (2013.01); *H01L 2224/16227* (2013.01); *H01L 2224/19* (2013.01); *H01L 2224/32225* (2013.01); *H01L 2224/73267* (2013.01); *H01L 2224/92244* (2013.01)

(58) Field of Classification Search
CPC ....... H01L 2224/16227; H01L 2224/19; H01L 2224/32225; H01L 2224/73267; H01L 2224/92244; H01L 21/50; H01L 23/482
USPC ........................................................ 382/124
See application file for complete search history.

(56) References Cited

U.S. PATENT DOCUMENTS

| | | | |
|---|---|---|---|
| 8,492,181 | B2 | 7/2013 | Ramasamy et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,553,062 | B1 | 1/2017 | Fan et al. |
| 9,711,379 | B2 | 7/2017 | Yu et al. |
| 9,741,690 | B1 | 8/2017 | Hsieh et al. |
| 9,793,230 | B1 | 10/2017 | Yu et al. |
| 2004/0067640 | A1 | 4/2004 | Hsu et al. |
| 2007/0243673 | A1* | 10/2007 | Kang .................. H01L 27/1255 |
| | | | 257/E27.113 |
| 2008/0242019 | A1 | 10/2008 | Yu |
| 2010/0171189 | A1 | 7/2010 | Liu |
| 2010/0245981 | A1* | 9/2010 | Yeo ........................ G02F 1/167 |
| | | | 359/296 |
| 2011/0291288 | A1 | 12/2011 | Wu et al. |
| 2012/0256280 | A1 | 10/2012 | Erhart et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0235071 | A1 | 8/2015 | Chang |
| 2015/0274507 | A1 | 10/2015 | Xu et al. |
| 2015/0274512 | A1 | 10/2015 | Xu et al. |
| 2015/0279808 | A1 | 10/2015 | Shen et al. |
| 2016/0256070 | A1 | 9/2016 | Murphy et al. |
| 2016/0350572 | A1 | 12/2016 | Kim et al. |
| 2016/0363555 | A1 | 12/2016 | Kang et al. |
| 2017/0228529 | A1 | 8/2017 | Huang et al. |
| 2017/0243046 | A1 | 8/2017 | Chang et al. |
| 2017/0330939 | A1 | 11/2017 | Chang et al. |
| 2017/0345731 | A1 | 11/2017 | Chiang et al. |
| 2017/0352626 | A1 | 12/2017 | Lin et al. |
| 2017/0369307 | A1 | 12/2017 | Karpman |
| 2018/0330138 | A1 | 11/2018 | Suwald |
| 2019/0304864 | A1 | 10/2019 | Kuo et al. |
| 2019/0340405 | A1 | 11/2019 | Chen et al. |

FOREIGN PATENT DOCUMENTS

| | | | | |
|---|---|---|---|---|
| CN | 106463476 | * | 2/2017 | .......... H05K 1/0271 |
| TW | M519281 U | | 3/2016 | |
| WO | 2016036667 A1 | | 3/2016 | |

* cited by examiner

FINGERPRINT SENSOR IN INFO STRUCTURE AND FORMATION METHOD

PRIORITY CLAIM AND CROSS-REFERENCE

This application is a continuation of U.S. patent application Ser. No. 16/511,721, entitled "Fingerprint sensor in InFO structure and Formation Method," filed Jul. 15, 2019, which is a continuation of U.S. patent application Ser. No. 15/254,357, entitled "Fingerprint sensor in InFO structure and Formation Method," filed Sep. 1, 2016, now U.S. Pat. No. 10,354,114 issued Jul. 16, 2019, which application claims the benefit of the U.S. Provisional Application No. 62/349,355, filed Jun. 13, 2016, and entitled "Fingerprint sensor in InFO structure and Formation Method," which applications are hereby incorporated herein by reference.

BACKGROUND

Fingerprint sensors are used to capture the fingerprint images. The fingerprint images may be used for identification purpose. For example, the captured fingerprint images may be searched in a database in order to match with pre-stored fingerprint images.

There are several ways of capturing fingerprint images, including optical, ultrasonic, passive capacitance, active capacitance, etc. In the passive capacitance and active capacitance methods, capacitance sensors use principles associated with capacitance in order to form fingerprint images. In these methods of imaging, sensor arrays are used. Each of the sensing electrodes in a sensor array acts as one plate of a parallel-plate capacitor. The dermal layer (which is electrically conductive) of the finger to be sensed acts as the other plate, and the non-conductive epidermal layer of the finger acts as a dielectric layer. The differences between the capacitance values of the sensing electrodes in the array reveal the ridges and valleys in the fingerprint.

A conventional fingerprint sensor includes a sensor die having a plurality of surface bond pads at a top surface. The bond pads are bonded to printed circuit boards etc. through wire bonding. The fingerprint sensor may further include a sensor array at the top surface, wherein the sensor array includes a plurality of sensing electrodes. The sensor die is molded in a molding compound, which covers and protects the bond wires and the sensor array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
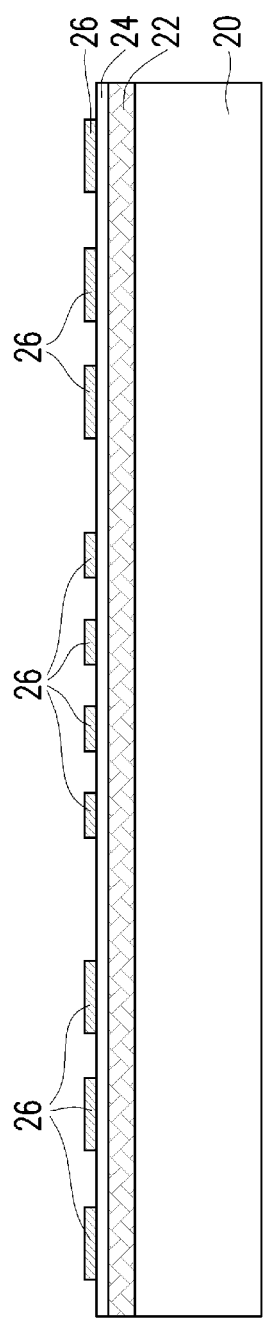
FIGS. 1 through 11B are cross-sectional views of intermediate stages in the formation of sensor packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A sensor package and the method for forming the sensor package are provided in accordance with various exemplary embodiments. The variations of the embodiments are discussed. Throughout the various views and illustrative embodiments, like reference numbers are used to designate like elements. It is appreciated that although fingerprint sensor packages are used as example, other types of sensor packages other than capturing fingerprint images may also be formed.

Figure 22:
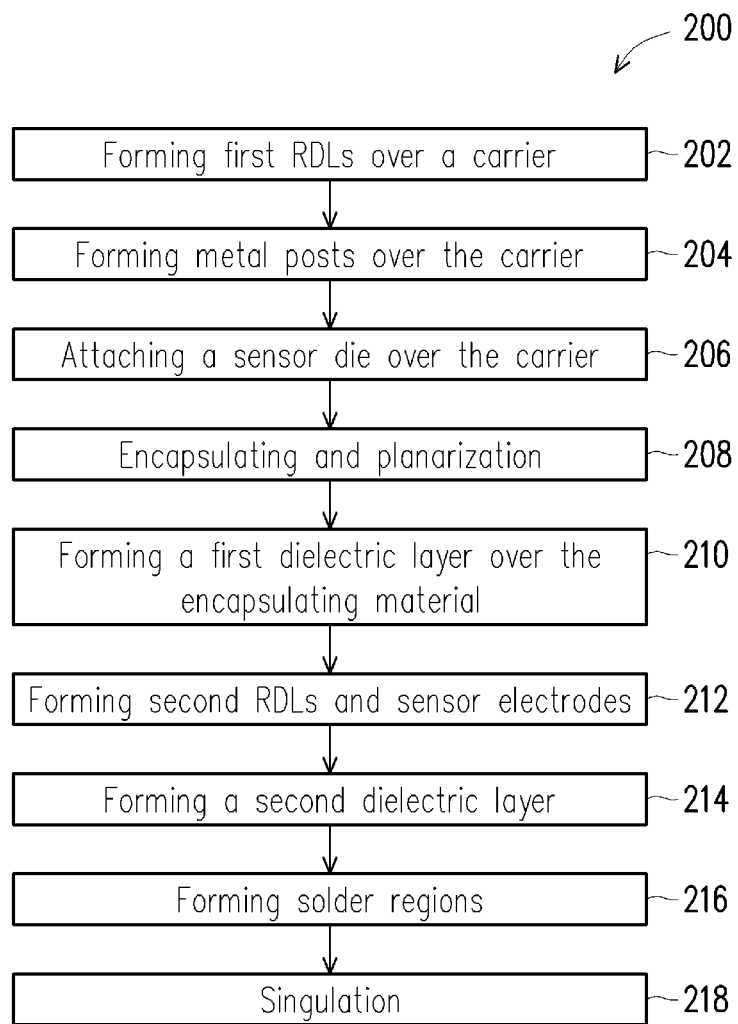
FIG. 22 illustrates a process flow for forming a sensor package in accordance with some embodiments.

FIGS. 1 through 11B illustrate the cross-sectional views of intermediate stages in the manufacturing of a sensor package in accordance with embodiments. The steps shown in FIG. 1 through 11B are also illustrated schematically in the process flow 200 shown in FIG. 22.

FIG. 1 illustrates carrier 20 and release layer 22 formed on carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. Release layer 22 may be coated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be easily patterned using a photo lithography process.

In accordance with alternative embodiments, dielectric layer 24 is formed of a nitride such as silicon nitride, an oxide such as silicon oxide, PhosphoSilicate Glass (PSG), Boro-Silicate Glass (BSG), Boron-doped PhosphoSilicate Glass (BPSG), or the like.

Figure 4:
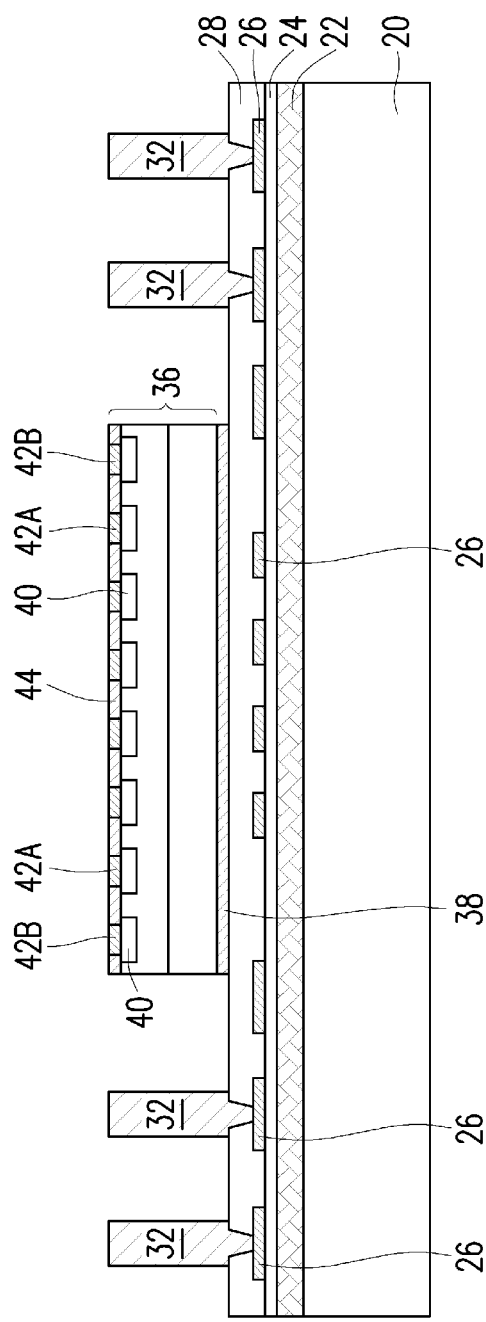

Redistribution Lines (RDLs) 26 are formed over dielectric layer 24. The respective step is shown as step 202 in the process flow shown in FIG. 22. RDLs 26 are also referred to as backside RDLs since they are located on the backside of sensor die 36 (FIG. 4). The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Figure 2:
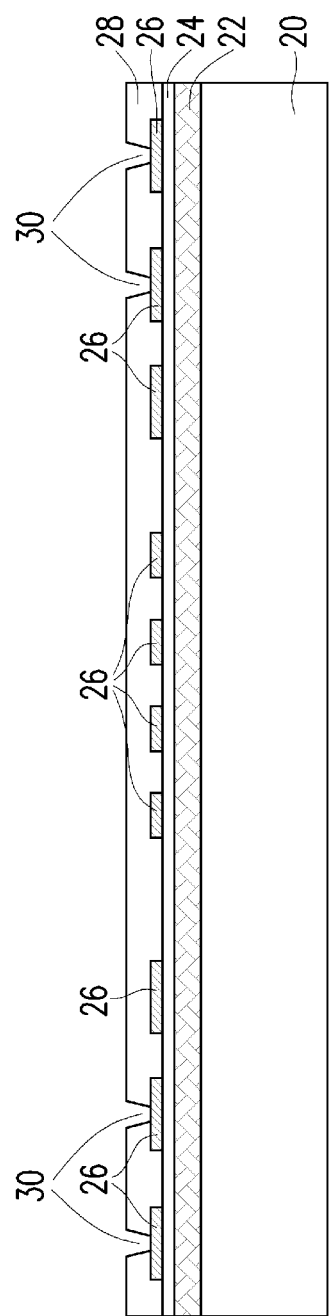

Referring to FIG. 2, dielectric layer 28 is formed on RDLs 26. The bottom surface of dielectric layer 28 may be in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. In accordance with alternative embodiments, dielectric layer 28 is formed of a nitride such as silicon nitride, an oxide such as silicon oxide, PSG, BSG, BPSG, or the like. Dielectric layer 28 is then patterned to form openings 30 therein. Hence, some portions of RDLs 26 are exposed through the openings 30 in dielectric layer 28.

Figure 3:
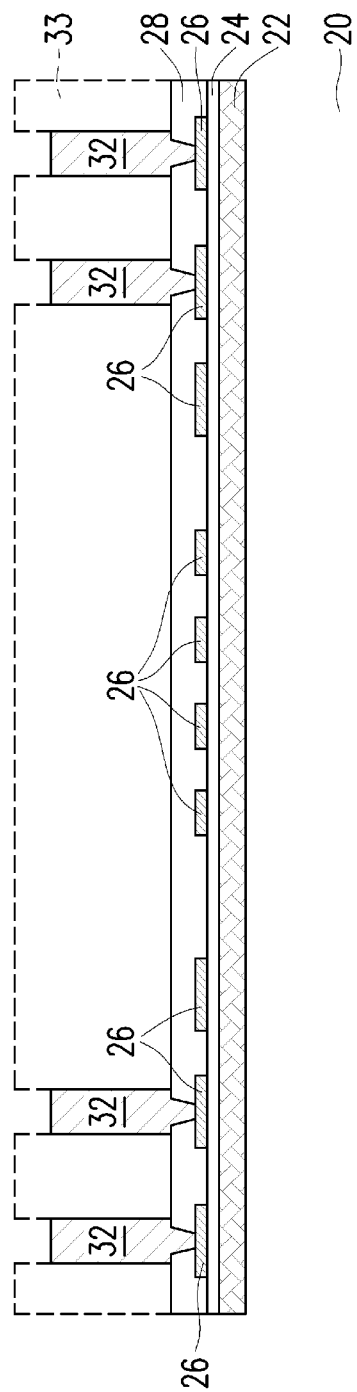

Referring to FIG. 3, metal posts 32 are formed. The respective step is shown as step 204 in the process flow shown in FIG. 22. Throughout the description, metal posts 32 are alternatively referred to as through-vias 32 since metal posts 32 penetrate through the subsequently formed molding material. In accordance with some embodiments of the present disclosure, through-vias 32 are formed by plating. Through-vias 32 are used for electrically inter-coupling the conductive features on the opposite ends of through-vias 32. The formation of through-vias 32 may include forming a blanket seed layer (not shown) over layer 28 and extending into openings 30 (FIG. 2), forming and patterning photo resist 33, and plating through-vias 32 on the portions of the seed layer that are exposed through the openings in photo resist 33. Photo resist 33 is then removed, and some portions of the seed layer are exposed. The exposed portions of the seed layer are then removed. The material of through-vias 32 may include copper, aluminum, or the like. The top-view shapes of through-vias 32 may be circles, rectangles, squares, hexagons, or the like. In accordance with some embodiments of the present disclosure, through-vias 32 are arranged to align to a ring (in the top view of the structure in FIG. 3) encircling a region therein, wherein the region is used for placing sensor die 36 (FIG. 4).

FIG. 4 illustrates the placement of sensor die 36. The respective step is shown as step 206 in the process flow shown in FIG. 22. Sensor die 36 is attached to dielectric layer 28 through Die-Attach Film (DAF) 38, which is an adhesive film. Sensor die 36 includes circuits that are related to the sensing of capacitance values and the processing of the sensed capacitance values. For example, sensor die 36 includes circuits 59 (FIG. 13) that are used to generate fingerprint images and to enhance the quality of the images, etc. Sensor die 36 may also include encryption circuits, memories, and/or the like.

In accordance with some exemplary embodiments, metal pillars 42A and 42B (such as a copper pillars, collectively referred to as metal pillars 42) are pre-formed as the topmost portion of sensor die 36, wherein metal pillars 42 are electrically coupled to the integrated circuit devices such as transistors (not shown) in sensor die 36 through metal pads 40. In accordance with some embodiments of the present disclosure, a polymer fills the gaps between neighboring metal pillars 42 to form top dielectric layer 44. Top dielectric layer 44 may also include a portion covering and protecting metal pillars 42. Polymer layer 44 may be formed of PBO in accordance with some embodiments of the present disclosure.

Sensor die 36 further includes an interconnect structure, which includes metal pads/lines (not shown) and metal vias formed in Inter-Metal Dielectric (IMD) layers (not shown). The IMD layers may be formed of low-k dielectric materials, which may have dielectric constants (k values) lower than about 3.0, lower than about 2.5, or even lower.

Metal pillars 42 may include metal pillars 42A and metal pillars 42B. Metal pillars 42A may form an array including a plurality of rows and columns in a top view of the structure, or may be arranged with a layout having a repeating pattern such as a beehive pattern. Metal pillars 42A may have a uniform size, a uniform top-view shape, a uniform top-view area, a uniform row pitch, and a uniform column pitch in accordance with some exemplary embodiments of the present disclosure. Metal pillars 42B may be aligned to one or a plurality rings that encircles metal pillars 42A.

Figure 5:
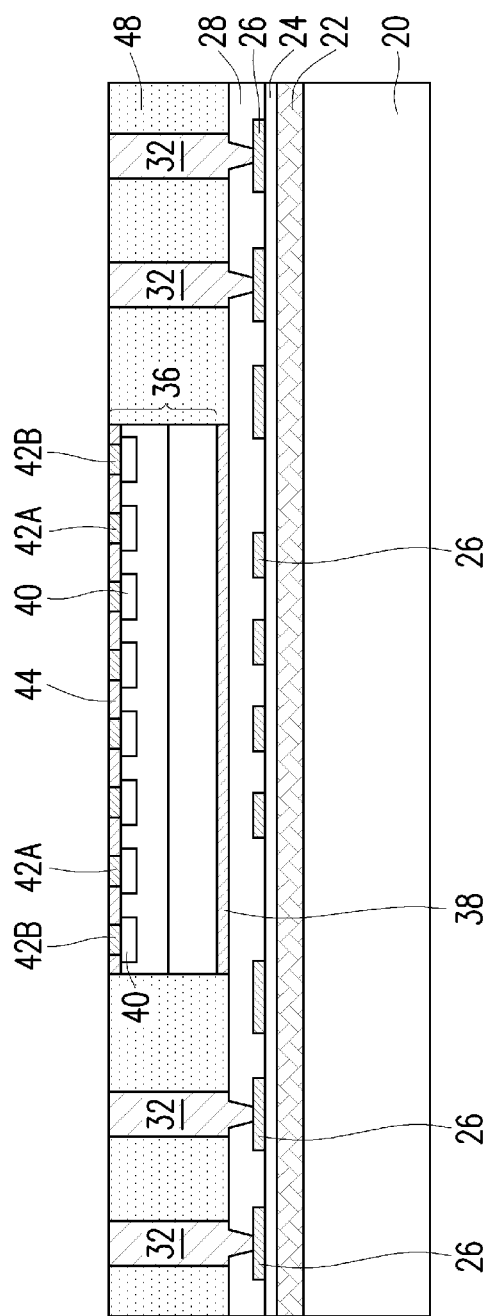

Next, encapsulating material 48 is used to encapsulate sensor die 36 and metal posts 32, as shown in FIG. 5. The respective step is shown as step 208 in the process flow shown in FIG. 22. Encapsulating material 48 fills the gaps between neighboring through-vias 32 and the gaps between through-vias 32 and sensor die 36. Encapsulating material 48 may include a molding compound, a molding underfill, an epoxy, and/or a resin. The top surface of encapsulating material 48 is higher than the top ends of metal pillars 42. Encapsulating material 48 may include a base material, which may be a polymer, a resin, an epoxy, or the like, and filler particles (not shown) in the base material. The filler particles may be dielectric particles of $SiO_2$, $Al_2O_3$, or the like, and may have spherical shapes.

In a subsequent step, a planarization such as a Chemical Mechanical Polish (CMP) step or a mechanical grinding step is performed to thin encapsulating material 48, until through-vias 32 and metal pillars 42 are exposed. The respective step is also shown as step 208 in the process flow shown in FIG. 22. Due to the planarization, the top ends of through-vias 32 are substantially level (coplanar) with the top surfaces of metal pillars 42, and are substantially coplanar with the top surface of encapsulating material 48.

Figure 6:
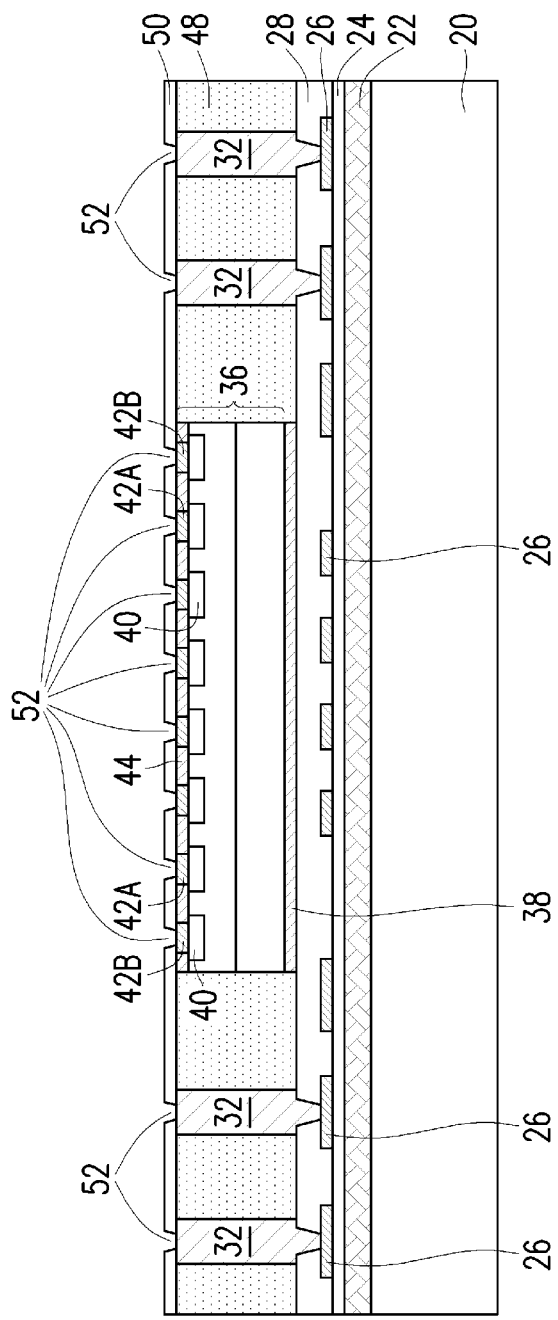
Figure 7:
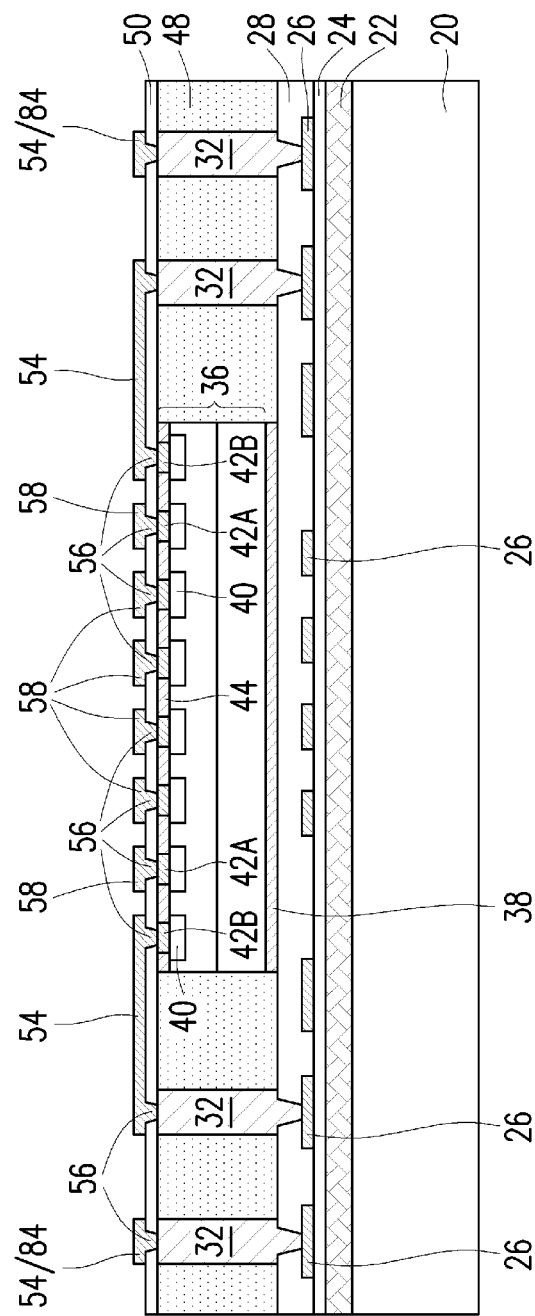
Figure 8:
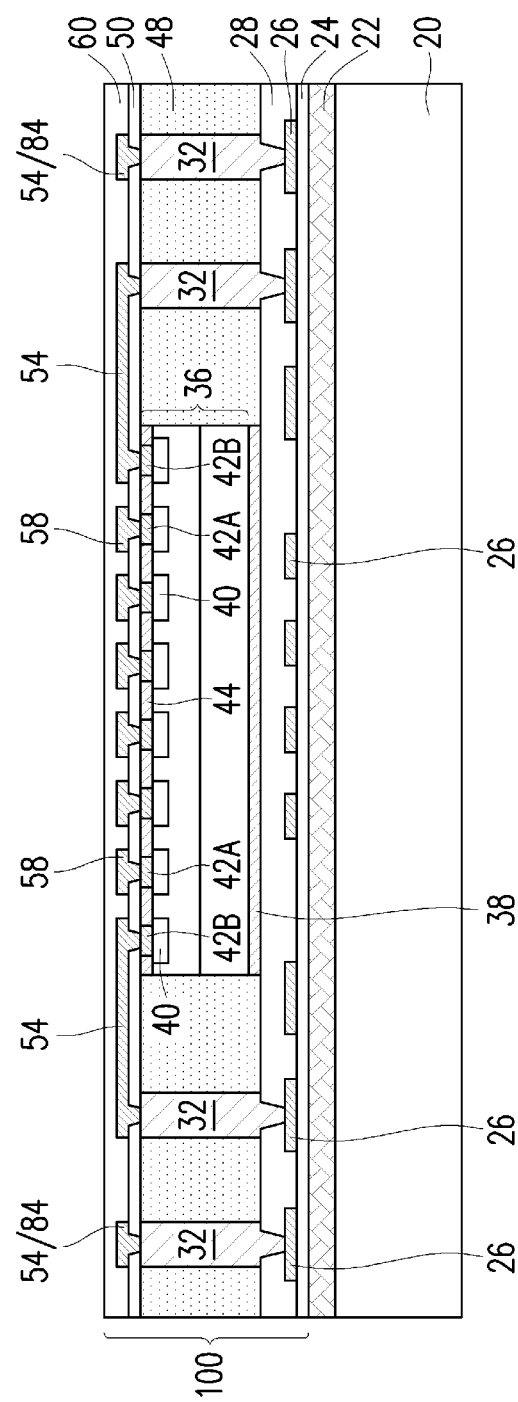

FIGS. 6 through 8 illustrate the formation of front-side RDLs, sensing electrodes, and the respective dielectric layers. Referring to FIG. 6, dielectric layer 50 is formed. The respective step is shown as step 210 in the process flow shown in FIG. 22. In accordance with some embodiments of the present disclosure, dielectric layer 50 is formed of a polymer such as PBO, polyimide, or the like. In accordance with alternative embodiments, dielectric layer 50 is formed of silicon nitride, silicon oxide, or the like. Openings 52 are formed in dielectric layer 50 to expose through-vias 32 and metal pillars 42. The formation of openings 52 may be performed through a photo lithography process.

Next, referring to FIG. 7, Redistribution Lines (RDLs) 54 are formed to connect to metal pillars 42 and through-vias 32. The respective step is shown as step 212 in the process flow shown in FIG. 22. RDLs 54 may also interconnect metal pillars 42B and through-vias 32. RDLs 54 include metal traces (metal lines) over dielectric layer 50 and vias 56 extending into dielectric layer 50. Vias 56 are connected to through-vias 32 and metal pillars 42B. In accordance with some embodiments of the present disclosure, RDLs 54 are formed in a plating process, wherein each of RDLs 54 includes a seed layer (not shown) and a plated metallic material over the seed layer. The seed layer and the plated material may be formed of the same material or different materials.

In addition, at the same time RDLs 54 are formed, sensing electrodes 58 are also formed in the same process. Each of sensing electrodes 58 is connected to one of metal pillars 42A through one of vias 56 in dielectric layer 50. Sensing electrodes 58 act as capacitor plates during the sensing (of fingerprint, for example). Accordingly, each of sensing electrodes 58 terminates in the respective RDL layer, and is not connected to any metal/conductive features in the RDL layer and any metal/conductive features over the RDL layer.

Figure 12:
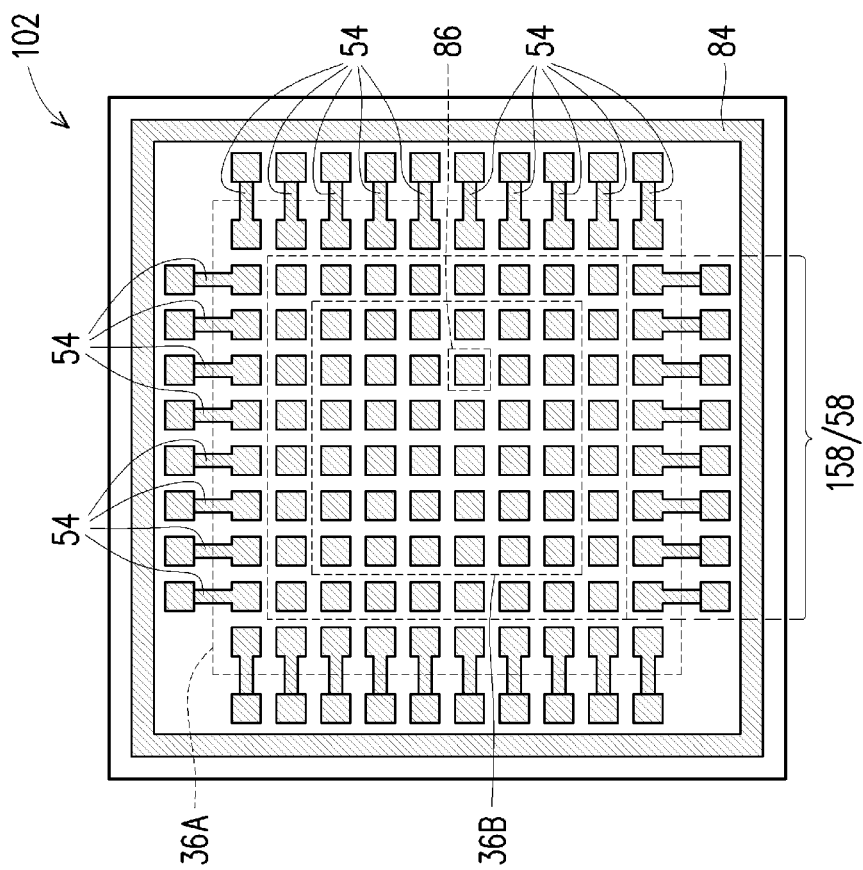
FIG. 12 is a top-view of an exemplary sensor package in accordance with some embodiments.

FIG. 12 illustrates a top view of sensing electrodes 58 and RDLs 54 in accordance with some exemplary embodiments of the present disclosure. As shown in FIG. 12, sensing electrodes 58 may form an array. Alternatively, sensing electrodes 58 may be arranged with other repeating layouts, for example, having a beehive pattern. Each sensing electrode 58 is connected to an underlying metal pillars 42A through one of vias 56, as shown in FIG. 7. Accordingly, sensing electrodes 58 and metal pillars 42A have a one-to-one correspondence.

Referring to FIG. 8, in accordance with various embodiments, dielectric layer 60 is formed to cover sensing electrodes 58 and RDLs 54. The respective step is shown as step 214 in the process flow shown in FIG. 22. Dielectric layer 60 in these embodiments may comprise a polymer(s) such as PBO, polyimide, BCB, or the like. Alternatively, dielectric layer 60 may include non-organic dielectric materials such as silicon oxide, silicon nitride, silicon carbide, silicon oxynitride, or the like. In accordance with some embodiments of the present disclosure, after the formation of dielectric layer 60, no opening is formed in dielectric layer 60. Also, no conductive feature is formed over sensing electrodes 58 in order to electrically connect to sensing electrodes 58 and RDLs 54. Throughout the description, the structure formed on carrier 20 is referred to as package 100, which may be a composite wafer including a plurality of sensor dies 36 arranged as an array.

Figure 9:
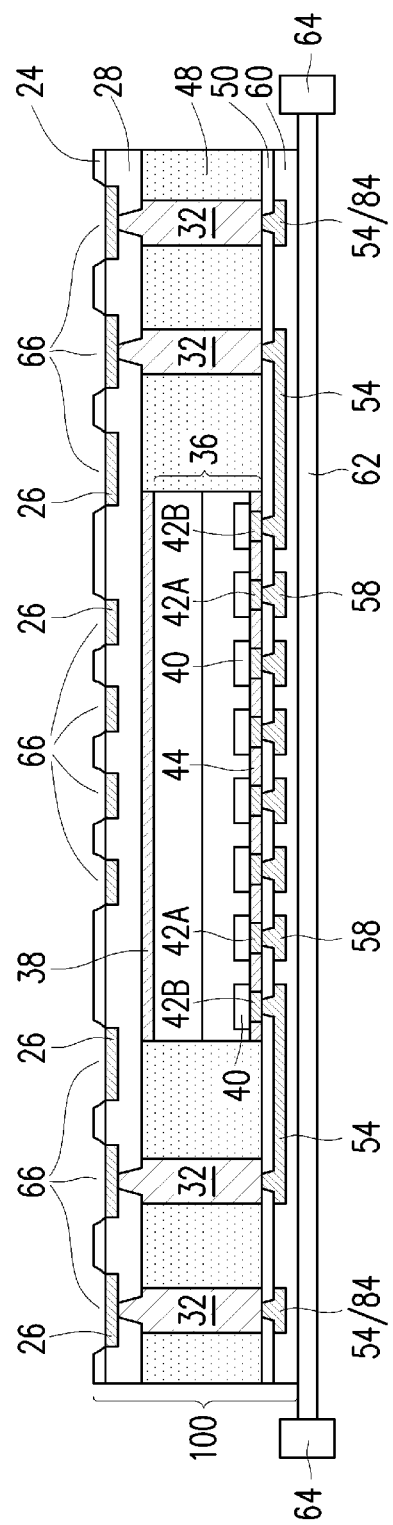
Figure 10:
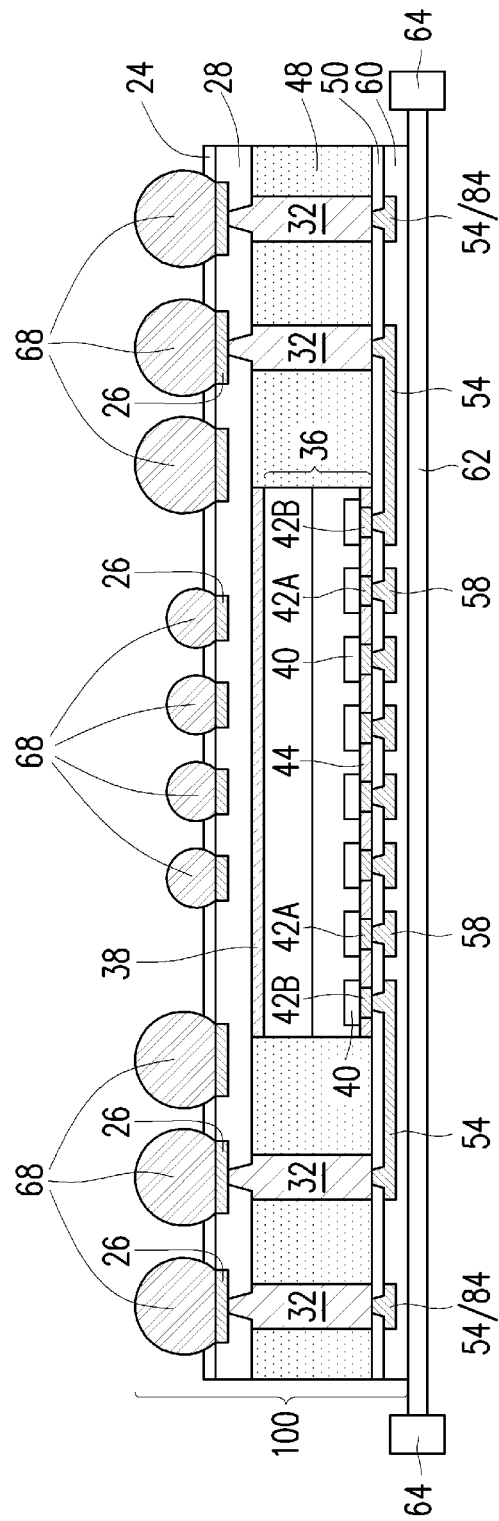

FIGS. 9 through 11 illustrate the remaining process in the formation of the sensor package. First, package 100 is de-bonded from carrier 20 (FIG. 8), for example, by projecting a UV light or a laser on release layer 22, so that release layer 22 decomposes in response to the heat of the UV light or the laser. The resulting structure is shown in FIG. 9. Package 100 may be placed on tape 62, which is fixed on frame 64 that forms a ring. Dielectric layer 60 may be adhered to tape 62.

Before or after the de-bonding of carrier 20, some parts of dielectric layer 24 are removed to expose metal pads, which are parts of RDLs 26. As a result, openings 66 are formed in dielectric layer 24. The formation of openings 66 may be achieved through laser burning. Alternatively, when dielectric layer 24 is formed of a light-sensitive material such as PBO or polyimide, the formation of openings 66 may also be achieved through a photo lithography process.

FIG. 10 illustrates the formation of solder regions 68. The respective step is shown as step 216 in the process flow shown in FIG. 22. For example, a printing step may be performed to print a solder paste in openings 66, followed by reflowing the solder paste to form solder regions 68. Alternatively, solder regions 68 are formed by dropping solder balls in openings 66 and then performing a reflow.

Figure 11A:
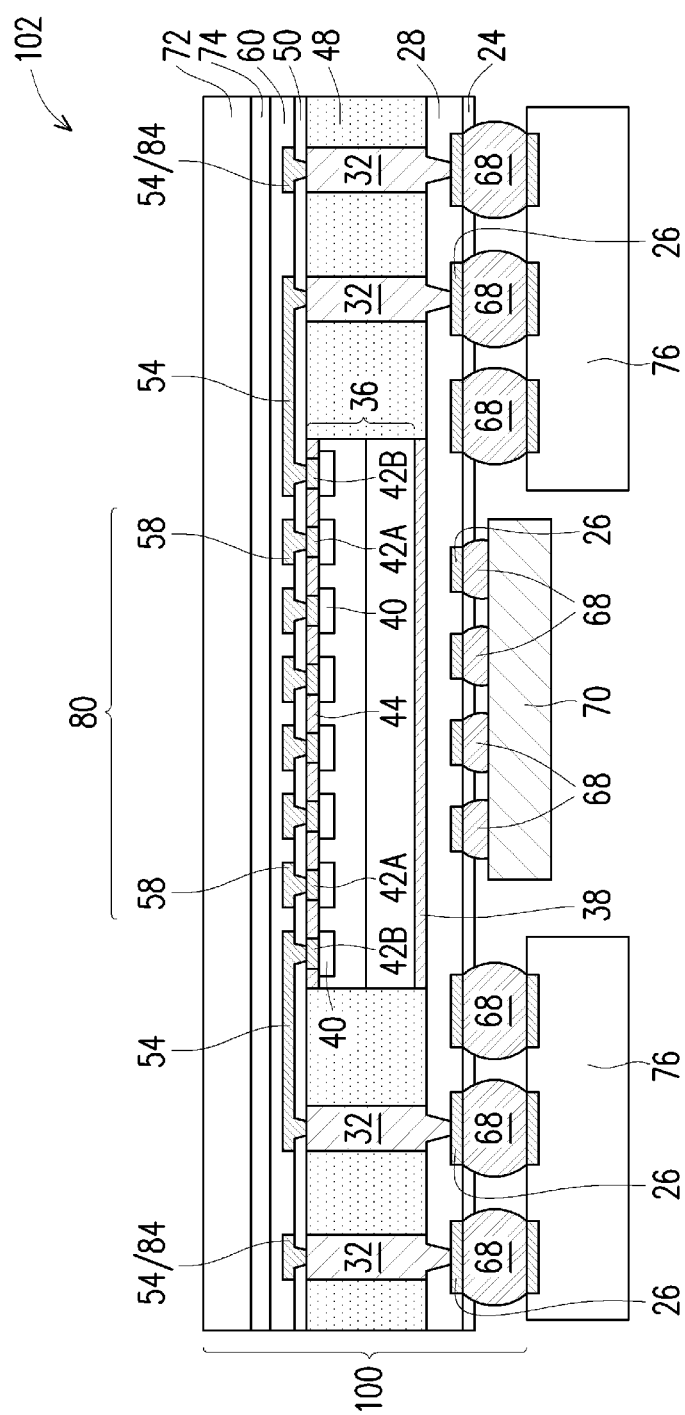

In subsequent steps, as show in FIG. 11A, a device die such as High-Voltage (HV) device die 70 is bonded to solder regions 68, which are electrically coupled to sensor die 36 through RDLs 54. Package 100 is flipped upside down, and glass plate 72 is attached to package 100 through adhesive 74. Package 100 may then be singulated in a die-saw process to form a plurality of identical packages, each including a portion of package 100 as illustrated. The respective step is shown as step 218 in the process flow shown in FIG. 22. Next, the singulated package may be connected to other package components 76, which may be a Printed circuit Board (PCB), a flex PCB, or the like. The resulting package shown in FIG. 11A is referred to as sensor package 102.

Package 102 may be used for capture fingerprint images, for example, when a finger is in contact with area 80 of glass plate 72, the plurality of sensing electrodes 58 forms a plurality of capacitors with the corresponding overlying parts of the finger. The capacitance values vary depending on whether a sensing electrode 58 forms a capacitor with a ridge or a valley of the skin of the finger, and the capacitance values may be used to generate a fingerprint image. Accordingly, be sensing capacitance values related to sensing electrodes 58, the fingerprint image is captured.

Figure 11B:
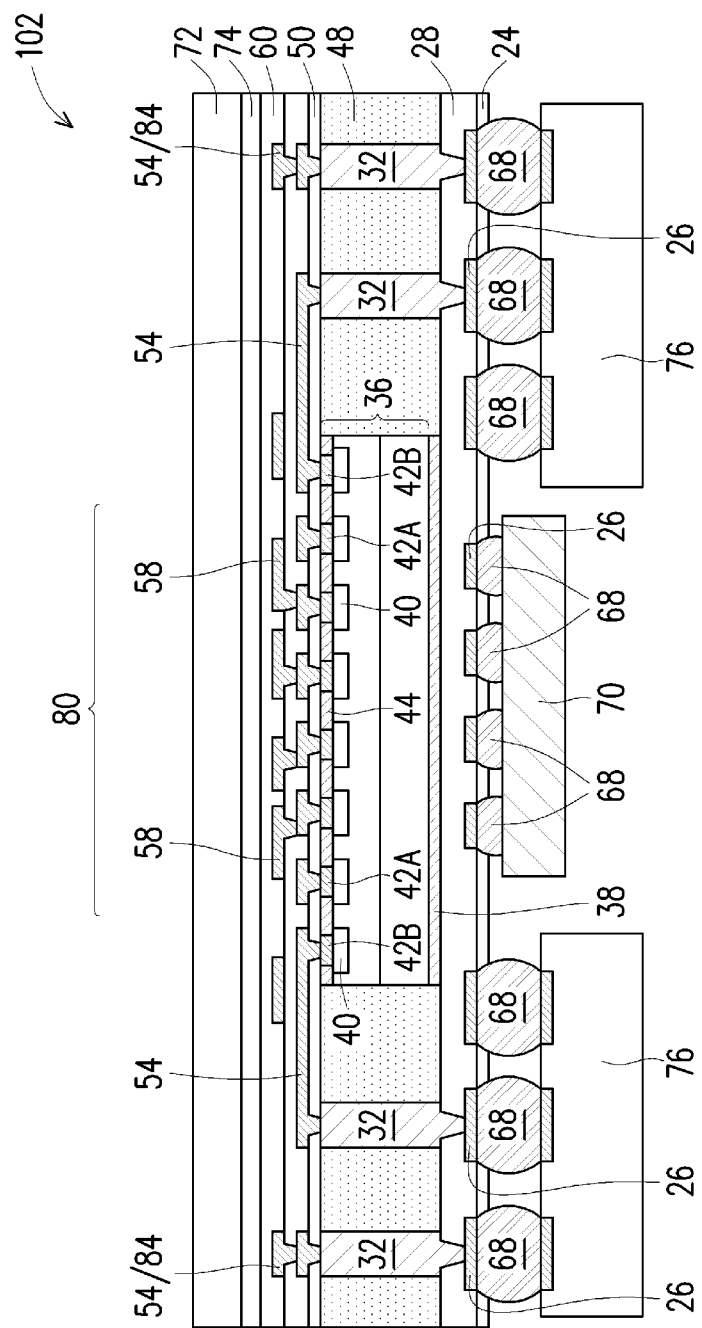

FIG. 11B illustrates package 102 in accordance with some embodiments. The package 102 in FIG. 11B is similar to the package 102 shown in FIG. 11A, except there is a plurality of RDL layers on the front side of sensor die 36. Accordingly, sensing electrodes 58 are formed in the top RDL layer, and some RDLs 54 are formed between, and interconnecting, sensing electrodes 58 and metal pillars 42. An advantageous feature of the embodiments in FIG. 11B is that the area of the sensing electrode array is no longer limited by the size of sensor die 36. Rather, the size of sensing electrode array may be adjusted (enlarged or shrunk, for example) to suit to the size of fingers or the sensed object. Forming an additional RDL layer underlying sensing electrodes 58 may also advantageously increase the distance between sensing electrodes 58 and the circuits 59 (such as transistors, FIG. 13) in sensor die 36, and hence reduces the interference of the circuits to sensing electrodes 58.

In accordance some embodiments, some RDLs 54 may form seal ring 84, as shown in FIGS. 11A and 11B, The seal ring 84 is formed in the front-side RDLs, and is adjacent to the edges of package 102. An exemplary seal ring 84 is shown in FIG. 12, which shows the top view of package 102 in accordance with some embodiments.

As shown in FIG. 12, sensing electrodes 58 form an array, which is surrounded by RDLs 54. The possible positions of the boundaries of sensor die 36 are marked as 36A and 36B, which are correspondent to the embodiments in FIGS. 11A and 11B, respectively. Accordingly, in the embodiments as shown by 36A, the top-view area of sensing electrode array 158 (formed of sensing electrodes 58) is greater than the top-view area of sensor die 36. In the embodiments as shown by 36B, the top-view area of sensing electrode array 158 is smaller than the top-view area of sensor die 36.

Figure 13:
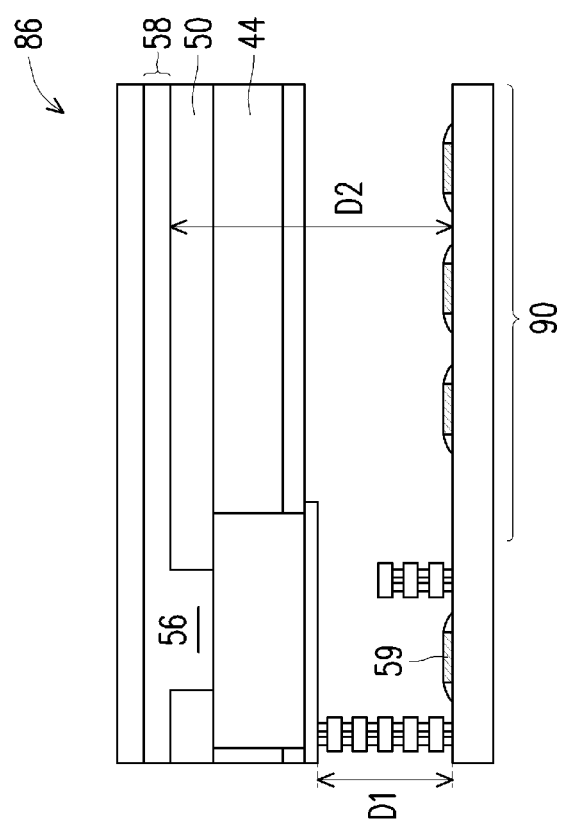
FIG. 13 is a cross-sectional view of a sensing unit in accordance with some embodiments.

Each of sensing electrodes 58 forms a sensing unit 86 in combination with the underlying circuits, wherein sensor die 36 includes a plurality of identical sensing units 86. An exemplary sensing unit 86 is marked in FIG. 12. FIG. 13 schematically illustrates a cross-sectional view of some components in sensing unit 86, which includes one sensing electrode 58. As shown in FIG. 13, sensing electrode 58 is electrically connected to processing circuit 59 (represented using a transistor), which, among other functions, has the function of detecting the capacitance value of the corresponding capacitor having sensing electrode 58 as one of the capacitor plates.

It is realized that the circuit 59 for performing the function specific to the corresponding sensing unit 86 occupies a small portion of the chip area overlapped by the corresponding sensing electrode 58. There is a large area 90 unused by circuit 59. In conventional sensor dies, area 90 cannot be used. The reason is that in conventional sensor dies, sensing electrodes are formed at the surface of the respective sensor die. The sensor die, however, is thin, and the vertical distance D1 between the sensing electrodes and the circuit (active devices) is small. As a result, if circuits are built in the unused area, the circuits will have high interference to the overlying sensing electrode, and will affect the measured capacitance values. In the embodiments of the present disclosure, by forming sensing electrodes in RDLs that is higher than the sensor die, distance D2 between sensing electrodes 58 and the circuits is increased, sometimes to three times distance D1 or greater. Accordingly, area 90 may be used to form circuits since the interference of the circuits to sensing electrodes is reduced to an acceptable level due to the increased distance D2.

FIGS. 14 through 21 illustrate cross-sectional views of intermediate stages in the formation of a fingerprint sensor package in accordance with some embodiments of the present disclosure. Unless specified otherwise, the materials and the formation methods of the components in these embodiments are essentially the same as the like components, which are denoted by like reference numerals in the embodiments shown in FIGS. 1 through 11B. The details regarding the formation process and the materials of the components shown in FIGS. 14 through 21 may thus be found in the discussion of the embodiments shown in FIGS. 1 through 11B.

Figure 14:
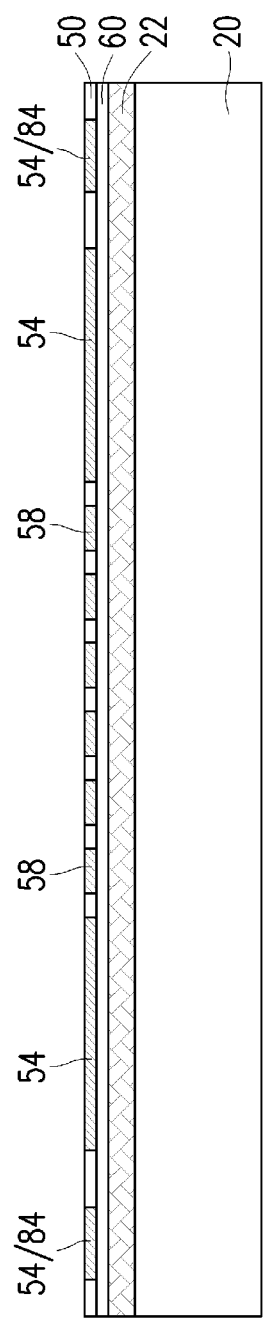
FIGS. 14 through 21 illustrate the cross-sectional views of intermediate stages in the formation of fingerprint sensor packages in accordance with some embodiments.

Referring to FIG. 14, release layer 22 is coated on carrier 20, and dielectric layer 60 is formed over release layer 22. Next, RDLs 54 and sensing electrodes 58 are formed over dielectric layer 60. RDLs 54 and sensing electrodes 58 are formed in dielectric layer 50 in accordance with some embodiments.

Figure 15:
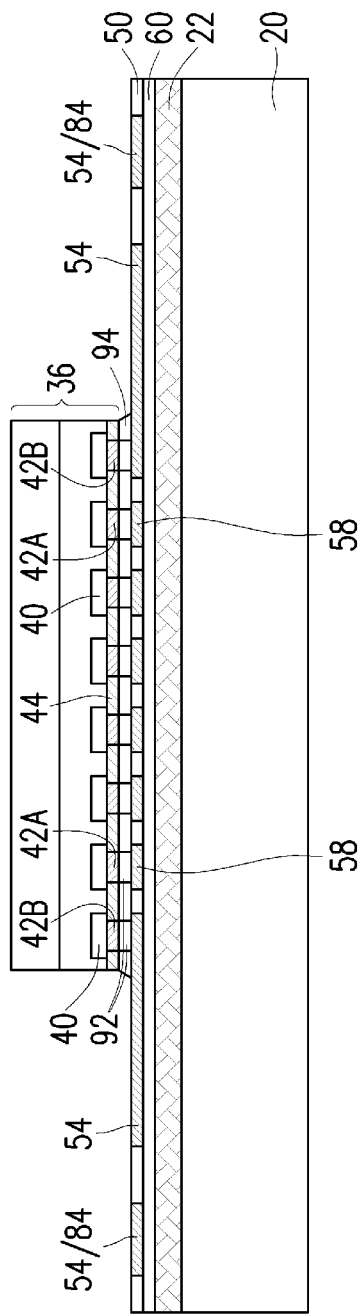

Next, referring to FIG. 15, sensor die 36 is bonded to sensing electrodes 58 through solder regions 92. Sensing electrodes 58 are thus in physical contact with solder regions 92. Underfill 94 is then filled into the gap between sensor die 36 and dielectric layer 50.

Figure 16:
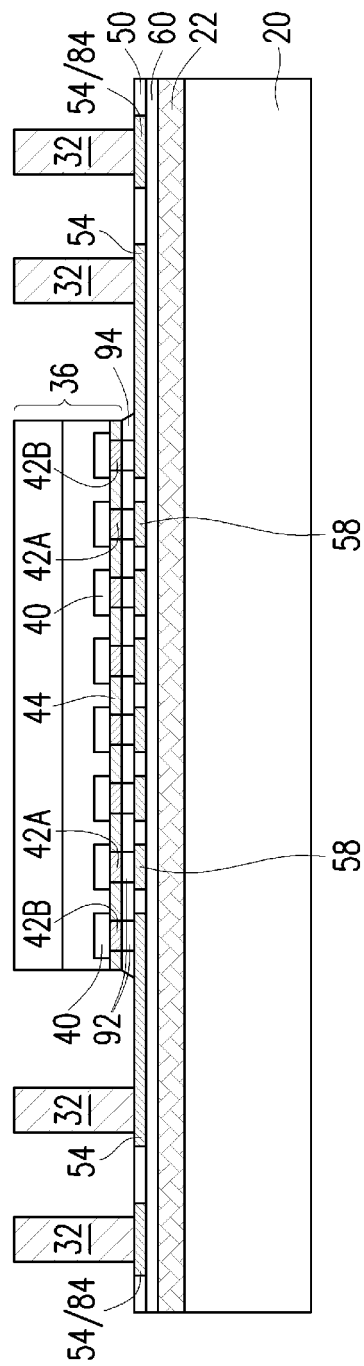
Figure 17:
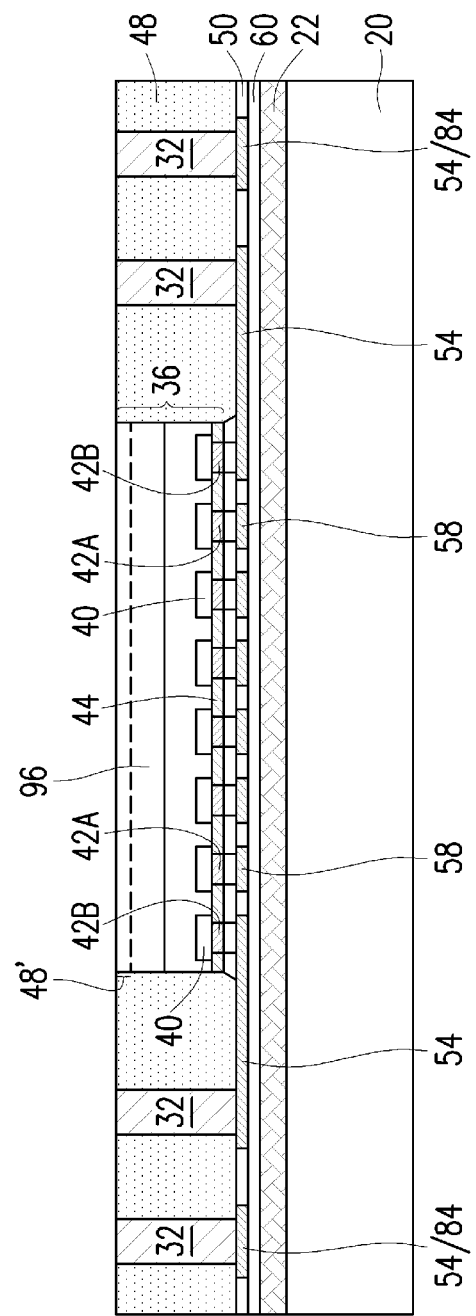

Referring to FIG. 16, through-vias 32 are formed through plating. The method of forming through-vias 32 is essentially the same as in the embodiments shown in FIGS. 3 and 4, and is not repeated herein. Next, sensor die 36 and through-vias 32 are encapsulated in encapsulating material 48, followed by a planarization step, as shown in FIG. 17. As a result of the planarization, through-vias 32 are exposed. In accordance with some embodiments of the present disclosure, semiconductor substrate 96 of sensor die 36 is exposed after the planarization. In accordance with alternative embodiments of the present disclosure, a layer of encapsulating material 48 is left on top of semiconductor substrate 96, wherein the remaining layer of encapsulating material 48 is illustrated as 48'. Encapsulating layer 48' is illustrated using a dashed line to indicate it may or may not exist in accordance with various embodiments.

Figure 18:
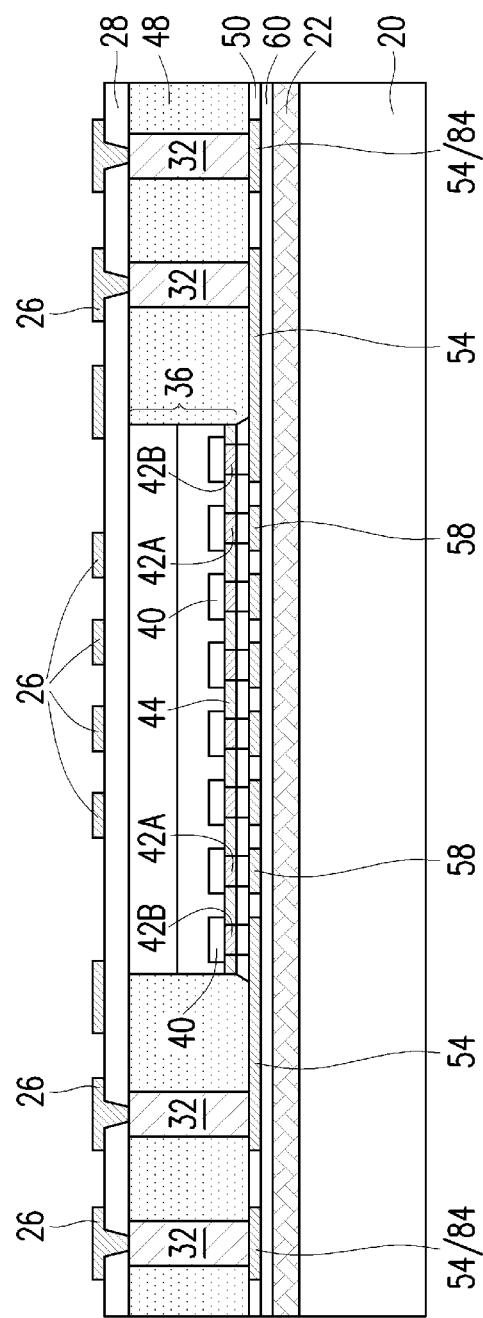
Figure 19:
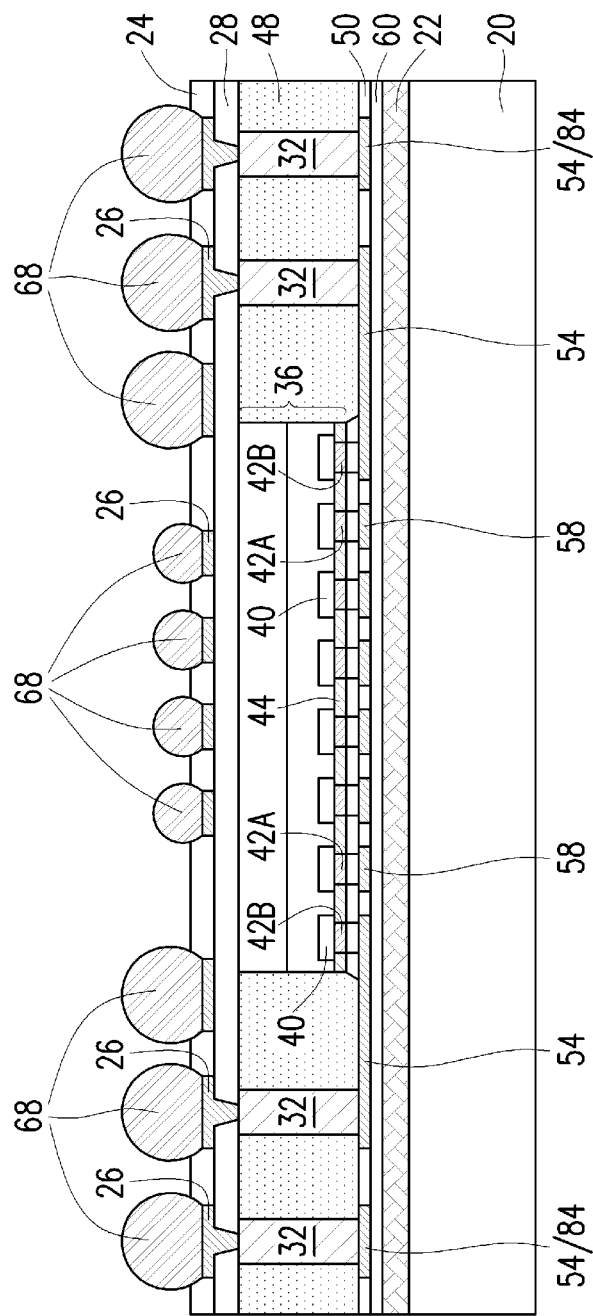
Figure 20:
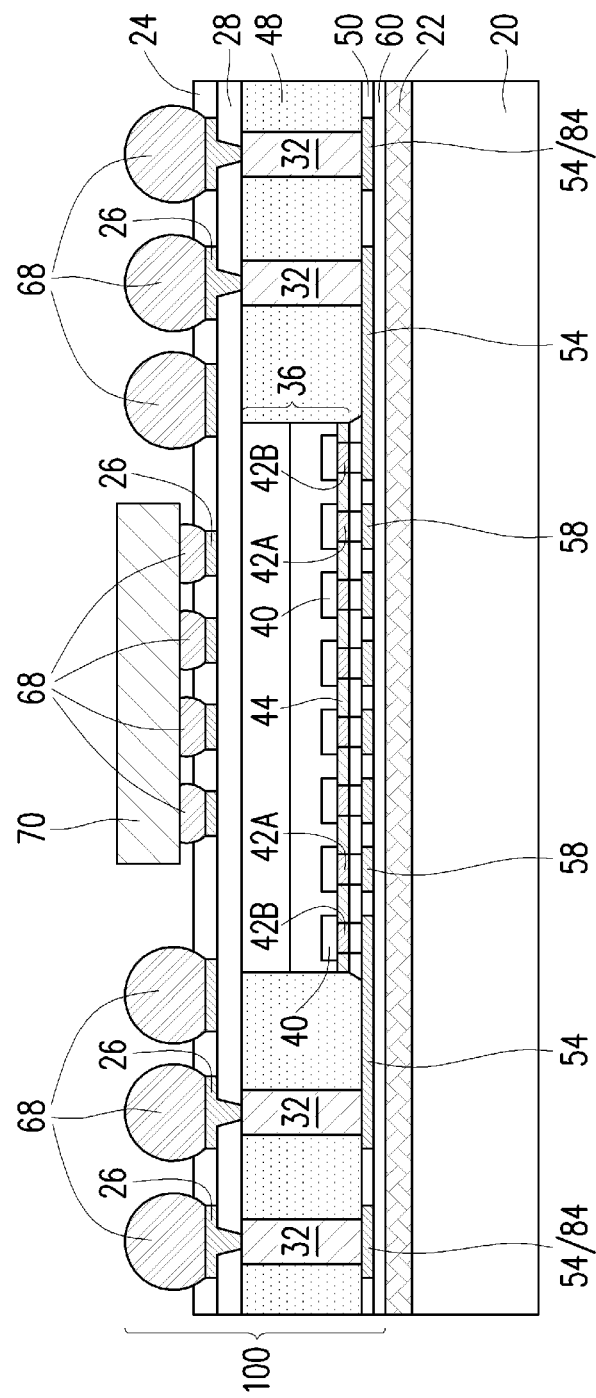
Figure 21:
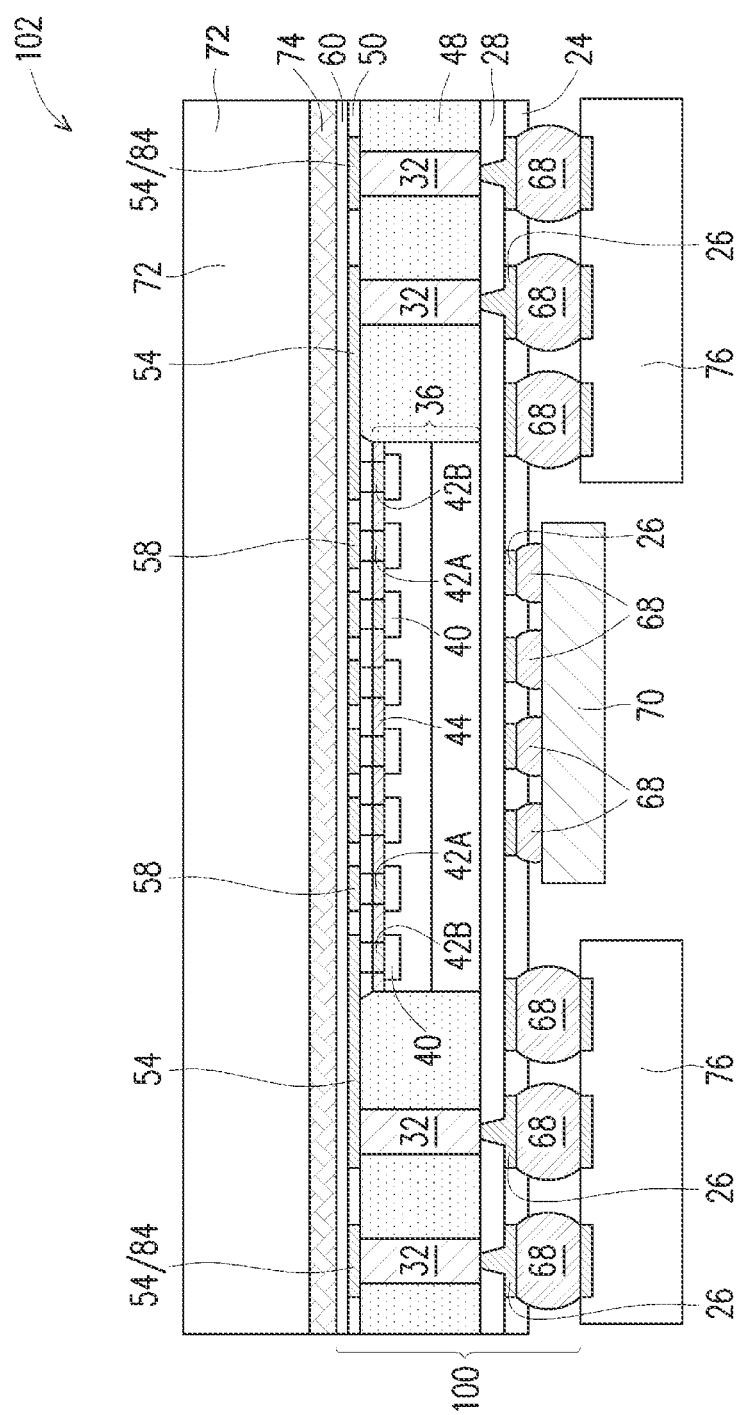

Next, Referring to FIG. 18, dielectric layer 28 is formed over encapsulating material 48 and sensor die 36, followed by the formation of RDLs 26. In a subsequent step, as shown in FIG. 19, dielectric layer 24 is formed to cover RDLs 26, and is then patterned to reveal the metal pads in RDLs 26. Solder regions 68 are formed to extend into the openings in dielectric layer 24, and device die 70 is bonded to RDLs 26 through solder regions 68, as shown in FIG. 20. Package 100 is thus formed.

In subsequent steps, package 100 is de-bonded from carrier 20, and glass plate 72 is adhered to package 100 through adhesive 74. Package 100 is then singulated, and the resulting structure is shown as package 102 in FIG. 21. Package component 76, which may be a PCB or a Flex PCB, is then connected to solder regions 68.

The embodiments of the present disclosure have some advantageous features. By forming sensing electrodes in RDLs rather than in sensor dies, the sensing electrodes are spaced farther apart from the circuits in the sensor die, and hence the circuits have lower interferences to the sensing electrodes. In addition, the sensing electrodes in RDLs, being formed in the top RDL layer, are closer to the top surface of the respective package. Accordingly, the sensitivity of the sensing is improved. In addition, the glass plate over the sensing electrodes may have an increased thickness without sacrificing the sensitivity. The durability of the sensor package is thus improved.

In accordance with some embodiments of the present disclosure, a package includes a sensor die, and an encapsulating material encapsulating the sensor die therein. A top surface of the encapsulating material is substantially coplanar with or higher than a top surface of the sensor die. A plurality of sensing electrodes is higher than the sensor die and the encapsulating material. The plurality of sensing electrodes is arranged as a plurality of rows and columns, and the plurality of sensing electrodes is electrically coupled to the sensor die. A dielectric layer covers the plurality of sensing electrodes.

In accordance with some embodiments of the present disclosure, a package includes a sensor die including a plurality of metal pillars at a top surface of the sensor die, and an encapsulating material encapsulating the sensor die therein. A top surface of the encapsulating material is substantially coplanar with a top surface of the sensor die. A first dielectric layer is over and contacting both the sensor die and the encapsulating material. A plurality of vias in the first dielectric layer. A sensing electrode array is disposed over the encapsulating material. The sensing electrode array has a plurality of sensing electrodes, each electrically coupled to a metal pillar in the plurality of metal pillars through one of the plurality of vias. A second dielectric layer has an upper portion over the sensing electrode array.

In accordance with some embodiments of the present disclosure, a method includes forming a metal post over a first dielectric layer, attaching a sensor die to a top surface of the first dielectric layer, encapsulating the metal post and the sensor die in an encapsulating material, planarizing the encapsulating material to expose metal pillars of the sensor die and the metal post, forming a second dielectric layer over the encapsulating material and the sensor die, and forming a redistribution layer. The redistribution layer includes a plurality of sensing electrodes electrically coupling to the metal pillars, and a redistribution line electrically intercoupling the sensor die and the metal post. A third dielectric layer is formed over the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    placing a sensor die;
    encapsulating the sensor die in an encapsulating material;
    forming a first dielectric layer overlapping both of the encapsulating material and the sensor die;
    forming a redistribution layer comprising:
        a plurality of sensing electrodes electrically coupling to the sensor die, wherein the plurality of sensing electrodes are over the first dielectric layer; and
    attaching a glass plate over the redistribution layer, wherein the sensor die is configured to capture capacitance values of capacitors formed between the plurality of sensing electrodes and an external feature contacting the glass plate.

2. The method of claim 1, wherein all top surfaces and sidewalls of each of the plurality of sensing electrodes are in contact with dielectric materials.

3. The method of claim 1, wherein the sensor die further comprises a plurality of conductive pillars at a top surface of the sensor die, wherein the encapsulating material is planarized after the encapsulating, and wherein when the encapsulating material is planarized, the plurality of conductive pillars are polished.

4. The method of claim 1 further comprising forming a plurality of vias in the first dielectric layer, wherein the plurality of vias electrically couple the plurality of sensing electrodes to a plurality of conductive pillars in the sensor die with a one-to-one correspondence.

5. The method of claim 1, wherein the sensor die and the encapsulating material are comprised in a package, and the method further comprises bonding a package component to the package.

6. The method of claim 1, wherein, the encapsulating comprises molding the sensor die in a molding compound.

7. The method of claim 1 further comprising forming a second dielectric layer covering, and physically contacting, the plurality of sensing electrodes, wherein the glass plate is attached over the second dielectric layer.

8. The method of claim 7, wherein the glass plate is attached to the second dielectric layer through an adhesive, with the adhesive in physical contact with both of the glass plate and the adhesive.

9. A method comprising:
    forming a fan-out redistribution structure over a sensor die, wherein the forming the fan-out redistribution structure comprises:
        placing the sensor die;
        forming a first dielectric layer, wherein the sensor die and the first dielectric layer are in contact with each other; and
        forming a first redistribution layer comprising a plurality of redistribution lines, wherein the first dielectric layer and the first redistribution layer laterally extend beyond edges of the sensor die, and the plurality of redistribution lines comprises a plurality of sensor electrodes electrically connected to the sensor die; and
    forming a second dielectric layer covering the first redistribution layer.

10. The method of claim 9, wherein the second dielectric layer has bottom surfaces contacting an entire top surface of each of the sensor electrodes.

11. The method of claim 9, wherein the sensor die comprises a plurality of conductive features at a surface of the sensor die, wherein the plurality of conductive features collectively form a first array occupying a first chip area, and the plurality of sensor electrodes collectively form a second array occupying a second chip area greater than the first chip area.

12. The method of claim 9, wherein the first dielectric layer and the first redistribution layer are formed before the sensor die is placed, and the sensor die is bonded to the first redistribution layer.

13. The method of claim 12, wherein the first dielectric layer and the first redistribution layer are formed on top of a carrier, and the sensor die is bonded to the sensor die through flip-chip bonding.

14. The method of claim 9, wherein the first dielectric layer and the first redistribution layer are formed after the sensor die is placed, and the first dielectric layer and the first redistribution layer are formed on top of the sensor die.

15. The method of claim 14 further comprising encapsulating the sensor die in an encapsulant, wherein the first dielectric layer is deposited directly over the sensor die and the encapsulant.

16. The method of claim 9 further comprising forming a second redistribution layer between the sensor die and the plurality of sensor electrodes, wherein the second redistribution layer comprises an additional plurality of redistribution lines connecting the sensor die to the plurality of sensor electrodes.

17. A method comprising:
    forming a package comprising:
        placing a sensor die;
        forming a sensor array comprising a plurality of sensing electrodes, wherein the sensor array is over a top surface of the sensor die, and the sensor array extends laterally beyond edges of the sensor die, and the plurality of sensing electrodes are electrically connected to a plurality of metal pillars in the sensor die; and
        forming a dielectric layer, wherein the dielectric layer and the sensor die are on opposing sides of the sensor array; and
    bonding a device die to the package, wherein the device die is electrically coupled to the sensor die.

18. The method of claim 17, wherein at a time the device die is bonded to the package, all of the plurality of sensing electrodes in the sensor array are terminal features that are at ends of conductive paths.

19. The method of claim 17 further comprising adhering a pre-formed glass plate over the dielectric layer.

20. The method of claim 17, wherein the sensor die is configured to sense capacitance values of a plurality of capacitors, with the sensor array forming capacitor plates of the plurality of capacitors.

* * * * *

UNITED STATES PATENT AND TRADEMARK OFFICE
CERTIFICATE OF CORRECTION

PATENT NO. : 11,741,737 B2  
APPLICATION NO. : 17/320639  
DATED : August 29, 2023  
INVENTOR(S) : Chen et al.

Page 1 of 1

It is certified that error appears in the above-identified patent and that said Letters Patent is hereby corrected as shown below:

On the Title Page

Item (73), in Column 1, In "Assignee", Line 3, delete "LTD," and insert -- LTD., --.

Signed and Sealed this  
Twenty-first Day of November, 2023

Katherine Kelly Vidal  
*Director of the United States Patent and Trademark Office*